United States Patent
Yashima

(10) Patent No.: US 7,556,973 B2
(45) Date of Patent: Jul. 7, 2009

(54) MANUFACTURING METHOD FOR SEMICONDUCTOR DEVICE

(75) Inventor: Hideaki Yashima, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 365 days.

(21) Appl. No.: 11/445,267

(22) Filed: Jun. 2, 2006

(65) Prior Publication Data
US 2006/0279303 A1    Dec. 14, 2006

(30) Foreign Application Priority Data
Jun. 2, 2005    (JP) .................... P2005-162660

(51) Int. Cl.
*H01L 21/66* (2006.01)
(52) U.S. Cl. .................. 438/15; 438/14; 438/16; 438/17; 438/18
(58) Field of Classification Search .......... 438/14, 438/15, 16, 17, 18
See application file for complete search history.

(56) References Cited
U.S. PATENT DOCUMENTS
5,426,060 A * 6/1995 Kawahara et al. ............. 438/16
5,654,204 A * 8/1997 Anderson .................... 438/15
6,349,240 B2    2/2002 Ogawa et al.

FOREIGN PATENT DOCUMENTS
JP    8-162512 A    6/1996

OTHER PUBLICATIONS
Chinese Office Action dated Jul. 13, 2007.

* cited by examiner

*Primary Examiner*—Kevin M Picardat
*Assistant Examiner*—Bac H Au
(74) *Attorney, Agent, or Firm*—Sughrue Mion, PLLC

(57) ABSTRACT

A Manufacturing method for a semiconductor device is provided and includes examining a semiconductor element on a semiconductor wafer, by an on-wafer test, storing on-semiconductor-wafer coordinate position data of the semiconductor devices and a result of the on-wafer test, and incorporating the semiconductor element, divided as individual pieces by dicing the semiconductor wafer, in packages followed by conducting a final test. When the semiconductor element is incorporated in the package, generated and stored is association data of the on-semiconductor-wafer coordinate position data with a mark on the package. Determined is the wafer test result of the semiconductor element in the package by referring the association data based on the mark of the package when conducting the final test. Skipped to perform is a test item, in which the result of the on-wafer test can be utilized, among test items to perform in the final test.

8 Claims, 2 Drawing Sheets

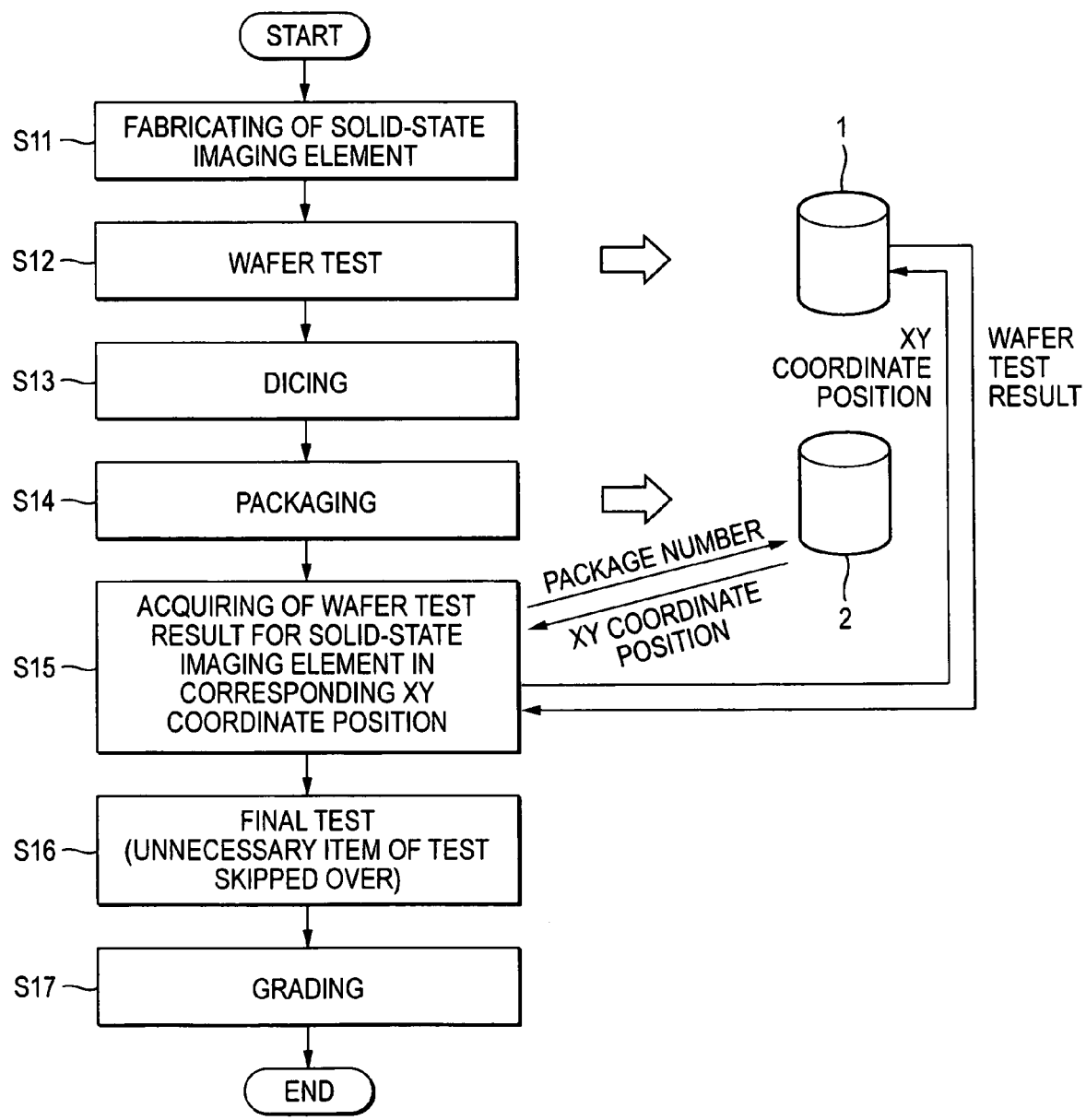

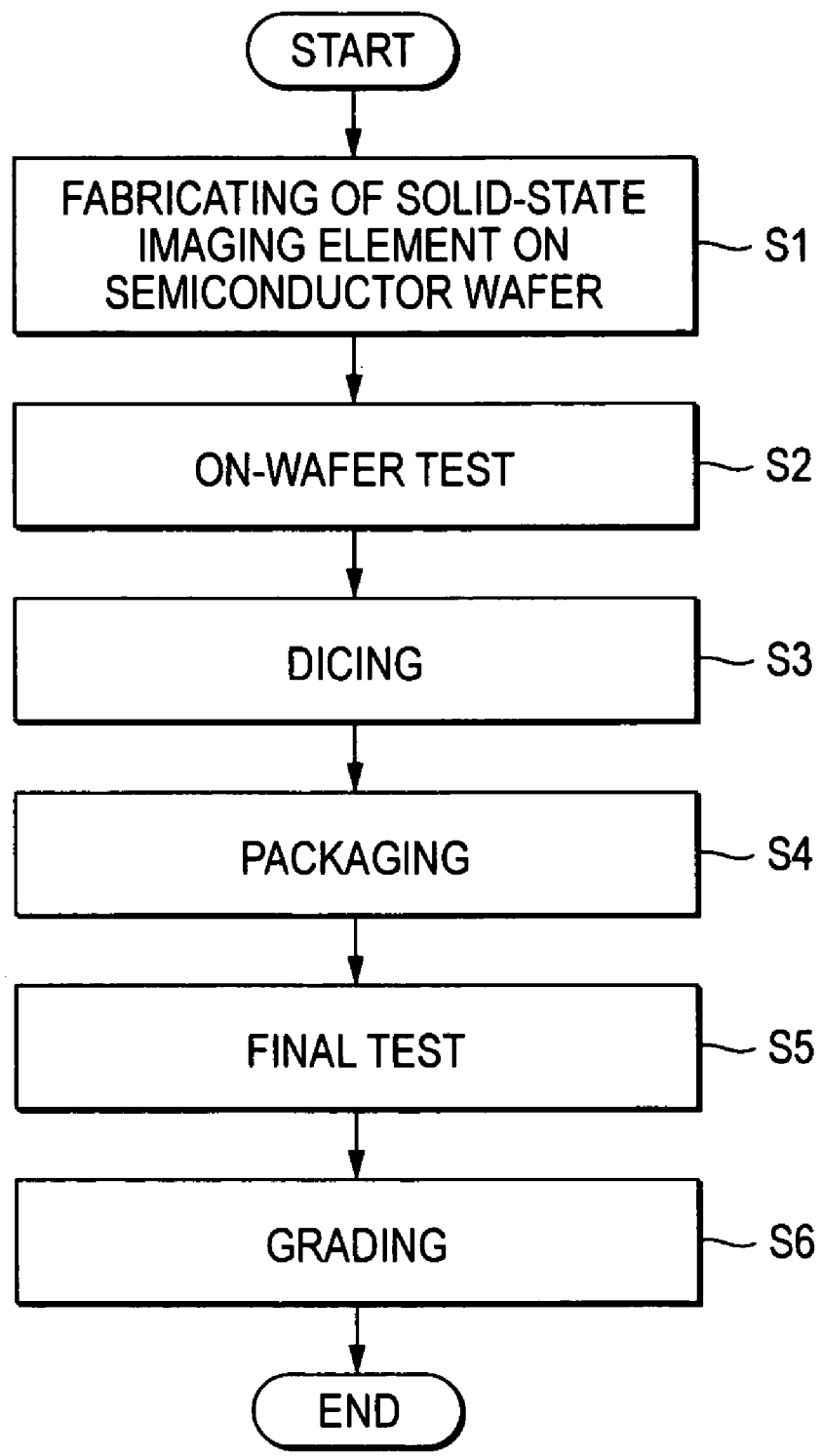

MANUFACTURING METHOD FOR SEMICONDUCTOR DEVICE

FIELD OF THE INVENTION

The invention relates to a manufacturing method for a semiconductor device wherein on-wafer and final tests are to be conducted, and more particularly to a manufacturing method for a semiconductor device that is suited for reducing the test time.

BACKGROUND OF THE INVENTION

The semiconductor elements manufactured by using a semiconductor integrated circuit technology are processed as described in JP-A-8-162512. Namely, the semiconductor elements are examined (on-wafer tested) in the stage those are fabricated on a semiconductor wafer. Then, the semiconductor wafer is diced into individual pieces of semiconductor elements, which are again tested (finally tested) in the stage where the semiconductor elements are respectively assembled in packages. In accordance with the result of the final test, the semiconductor devices (packaged semiconductor elements) are graded.

This is the same case as in the solid-state imaging element. Namely, as shown in FIG. 2, after a plurality of solid-state imaging elements are fabricated on a semiconductor wafer (step S1), an on-wafer test is conducted (step S2) to thereby examine the individual solid-state imaging elements on the wafer. Then, the semiconductor wafer is diced into individual pieces of solid-state imaging elements. The solid-state imaging elements, only which have been determined acceptable in the wafer test, are respectively encapsulated in ceramic packages (step S4), to again conduct an examination (final test) on the solid-state imaging devices (the packaged solid-state imaging elements) (step S5). In accordance with the result of the final test, the solid-state imaging devices are graded (step S6).

In the case of manufacturing a semiconductor device, final test is conducted in addition to on-wafer test. It is a usual practice to implement a grading of semiconductor devices, such as memories or CPUs, based upon the operation speed thereof The semiconductor device, if operable higher in speed, is graded higher.

Contrary to this, it is impossible to grade solid-state imaging devices. A variety of test data is required. For example, the solid-state imaging device, if less in pixel defects, is higher in grade. However, when the solid-state imaging device is illuminated with examination light during testing, if there is no occurrence of shading, then it is determined high in grade. In case shading occurs, it is low in grade even if less in pixel defects.

In this manner, grading of solid-state imaging devices is not simple but a broad range of data is required for grading. The number of items for testing the solid-sate imaging devices is greater as compared to that of the semiconductor devices, such as memories. This requires a longer time in the test process correspondingly. Moreover, because of the requirement of twice tests, i.e. on-wafer and final tests, the time required in the test process problematically increases manufacturing cost.

SUMMARY OF THE INVENTION

An object of an illustrative, non-limiting embodiment of the invention is to provide a manufacturing method for a semiconductor device, in which the test time can be shortened for a semiconductor device, such as a solid-state imaging device.

A Manufacturing method for a semiconductor device, in an exemplary embodiment of the invention, includes: examining each of a plurality of semiconductor elements on a semiconductor wafer by an on-wafer test to store a result of the on-wafer test and coordinate position data of the each of the semiconductor elements on the semiconductor wafer, the result of the on-wafer test and the coordinate position data being associated with each other; dicing the semiconductor wafer into individual pieces of the semiconductor elements; incorporating each of the individual pieces of the semiconductor elements into a package, wherein an association data of a mark on the package with the coordinate position data with respect to each of the semiconductor elements; and conducting a final test of each of the semiconductor elements in the package, the final test comprising: obtaining a result of the on-wafer test with respect to the each of the semiconductor elements in the package by referring to the association data based on the mark of the package; and skipping to perform a test item, in which the result of the on-wafer test can be utilized, among test items to perform in the final test.

In an exemplary embodiment of the manufacturing method, each of the semiconductor elements is a solid-state imaging element.

In an exemplary embodiment of the manufacturing method, the semiconductor device is graded based on results of the on-wafer and final tests of a semiconductor element corresponding to the semiconductor device.

According to an exemplary embodiment of the invention, it is possible to skipping to perform a test item, in which the result of the on-wafer test can be utilized as it is, among the test items to perform in the final test. This makes it possible to reduce the time of the final test. Particularly, by applying to a solid-state imaging device requiring plural items of test, cost can be reduced for the solid-state imaging device.

BRIEF DESCRIPTION OF THE INVENTION

FIG. 1 is a flowchart showing a procedure of a manufacturing method for a solid-state imaging device according to an exemplary embodiment of the invention.

FIG. 2 is a flowchart showing the manufacturing procedure for a solid-state imaging device in the related art.

DETAILED DESCRIPTION OF THE INVENTION

An exemplary embodiment of the invention will be explained below with reference to the drawings.

FIG. 1 is a flowchart showing a manufacturing procedure of a solid-state imaging device according to an exemplary embodiment of the invention. First of all, a plurality of solid-state imaging elements, such as CCDs, are fabricated on each of a plurality of semiconductor wafers (step S11). The individual semiconductor wafer is managed by means of management numbers, etc. and associated with the respective ones of manufacturing data. However, marks, such as identification numbers, are not provided respectively to the solid-state imaging elements of the wafer, similarly to the related art. Although the manufacturing system in the related art can be additionally provided with a marking device to put a mark to each solid-state imaging element, there encounters a mount-up of marking-device making cost. Accordingly, in this embodiment, no marking is made to solid-state imaging elements in this stage.

Then, by using a probe device, a wafer test is conducted to examine the individual solid-state imaging elements on the wafer while illuminating test light to the individual solid-state imaging elements (step S12). The result of the wafer test is stored in a database 1. In the database 1, the test result of a solid-state imaging element is stored in association with a position of X-coordinate=a and Y-coordinate=b on a semiconductor wafer having a management number N.

Then, the semiconductor wafer is bonded on a dicing tape. The solid-state imagers are cut apart by means of a dicing blade, into individual pieces of solid-state imaging elements.

Then, by means of a die bonder device, the solid-state imaging element is encapsulated in a ceramic package. The die bonder has a controller which retrieves through the database 1 to thereby determine an XY coordinate position of a solid-state imaging element having been determined acceptable in the wafer test. The solid-state imaging element, in the XY coordinate position, is stripped off the dicing tape and moved into a ceramic package. After bonding it, encapsulation is made over the ceramic package (step S14).

In the step S14, because a mark, such as serial number, is marked on the ceramic package, the serial number, etc. is read out to recognize the characters thereof by a camera, etc. Thus, stored to a database 2 is association data of a ceramic package serial number, etc. with an on-semiconductor-wafer XY coordinate position of a solid-state imaging element encapsulated in the ceramic package.

The solid-state imaging element thus packaged requires a final test, as in ones of the related art. In order to reduce the final test time, this embodiment first reads a serial number, etc. out of the ceramic package of the solid-state imaging element to test. The database 2 is retrieved through to determine an on-semiconductor-wafer XY coordinate position corresponding to the package serial number. Then, the first database I is retrieved through for the wafer test result of the solid-state imaging element relevant to the XY coordinate position (step S15). The test apparatus for conducting a final test is basically furnished with a camera. The camera can be used to read out a package serial number without the need to newly set up a camera.

In the final test, examination can be skipped over as to the test items in which the on-wafer test result can be utilized as it is, to conduct a test only on the test items that examination is required in the final test (step S16).

The test items, in which a wafer test result is satisfactorily utilized without conducting a final test, include
 (a) sensitivity
 (b) charge-transfer efficiency, and
 (c) OFD-voltage-optimization scanning.

The test items, that have been already examined in the on-wafer test but requires to examine similarly again in the final test, include
 (d) DC characteristic, and
 (e) pixel defects on the light-receiving surface due to foreign matter.

Finally, the solid-state imaging devices (the packaged solid-state imaging elements) are graded depending upon the electric characteristic, unique to the solid-state imaging devices, obtained as a result of the on-wafer and final tests (step S17).

The grading is conducted by use of a grading function (function to classify a tested solid-state imaging device as a good or poor product and transport it to a separate receiver) existing in nature on a handler device appended to the test apparatus for conducting a test of a packaged solid-state imaging device. The grading of solid-state imaging device is conducted, say, as in the following manner.

Grade 1: those good in shading characteristic (for a solid-state imaging device for a digital still camera requiring a shading characteristic).

Grade 2: those not good in shading characteristic (for a solid-state imaging device for a digital still camera that has a margin in the optical system thus provide less affect of the characteristic possessed by the solid-state imaging device).

Grade 3: those having a point pixel defect in the light-receiving surface (for a solid-state imaging device for a digital still camera mounting a function to correct for a point pixel defect).

Grade 4: those having a linear pixel defect in the light-receiving surface (for a solid-state imaging device for a digital still camera mounting a function to correct for a linear pixel defect).

Grade 5: those having various defects but operable (for a solid-state imaging device for an inexpensive digital still camera or a toy, within the scope acceptable in respect of image quality).

Grade 6: those highly balanced and completed in respect of the major performance (for a solid-state imaging device for a digital still camera of higher-grade model).

As described so far, the manufacturing method in the embodiment, when packaging a solid-state imaging element, is to produce association data of an on-wafer XY coordinate position of the solid-state imaging element with a serial number on the package, in order to associate an on-wafer test result of the solid-state imaging element in a packaged solid-state imager with the serial number on the package. Accordingly, a great alteration is not required for the solid-state imaging device-manufacturing system in the related art. As for the test item in which an on-wafer test result is usable, examination can be skipped over in the final test, thus making it possible to reduce the time required in the final test.

An exemplary manufacturing method for a semiconductor device in the invention is useful if applied to a manufacturing method for a semiconductor device, particularly for a solid-state imaging device because of the capability to reduce the time required for the final test without greatly altering the manufacturing system in the related art.

It will be apparent to those skilled in the art that various modifications and variations can be made to the described embodiments of the present invention without departing from the spirit or scope of the invention. Thus, it is intended that the present invention cover all modifications and variations of this consistent with the scope of the appended claims and their equivalents.

This application is based on Japanese Patent Application No. JP2005-162660, filed on Jun. 2, the contents of which is incorporated herein by reference.

What is claimed is:

1. A method for manufacturing a semiconductor device, comprising:
 examining each of a plurality of semiconductor elements on a semiconductor wafer by an on-wafer test,
 storing a result of the on-wafer test and coordinate position data of the each of the semiconductor elements on the semiconductor wafer, the result of the on-wafer test and the coordinate position data being associated with each other,
 dicing the semiconductor wafer into individual pieces of the semiconductor elements,
 incorporating each of the individual pieces of the semiconductor elements into a package, associating data of a mark on the package with the coordinate position data with respect to each of the semiconductor elements, conducting a final test of each of the semiconductor elements in the package for at least one first test item, and obtaining a result of the on-wafer test with respect to the each of the semiconductor elements in the package by referring to the association data based on the mark of the package for at least one of a second test item.

2. The method for manufacturing a semiconductor device according to claim 1, wherein each of the semiconductor elements is a solid-state imaging element.

3. The method for manufacturing a semiconductor device according to claim 2, further comprising grading each of the semiconductor elements in the package based on results of the on-wafer and final tests with respect to the each of the semiconductor elements.

4. The method for manufacturing a semiconductor device according to claim 3, wherein the at least one second test item comprises at least one of the group consisting of: sensitivity, charge-transfer efficiency, and OFD-voltage optimization scanning; and the at least one first test item comprises at least one of the group consisting of: DC characteristic and pixel defects on the light surface due to foreign matter.

5. The method for manufacturing a semiconductor device according to claim 2, wherein the at least one second test item comprises at least one of the group consisting of: sensitivity, charge-transfer efficiency, and OFD-voltage optimization scanning; and the at least one first test item comprises at least one of the group consisting of: DC characteristic and pixel defects on the light surface due to foreign matter.

6. The method for manufacturing a semiconductor device according to claim 1, further comprising grading each of the semiconductor elements in the package based on results of the on-wafer and final tests with respect to the each of the semiconductor elements.

7. The method for manufacturing a semiconductor device according to claim 6, wherein the mark of the package is referred to by reading the mark with a camera.

8. The method for manufacturing a semiconductor device according to claim 1, wherein the mark of the package is referred to by reading the mark with a camera.

* * * * *